United States Patent
Yeh

(10) Patent No.: US 7,518,424 B2
(45) Date of Patent: Apr. 14, 2009

(54) SLEW RATE CONTROLLED OUTPUT CIRCUIT

(75) Inventor: Chun-Yuan Yeh, Zhubei (TW)

(73) Assignee: Elite Semiconductor Memory Technology Inc. (TW)

( * ) Notice: Subject to any disclaimer, the term of this patent is extended or adjusted under 35 U.S.C. 154(b) by 0 days.

(21) Appl. No.: 10/983,917

(22) Filed: Nov. 8, 2004

(65) Prior Publication Data

US 2006/0097764 A1    May 11, 2006

(51) Int. Cl.
*H03K 5/12* (2006.01)
(52) U.S. Cl. .................. 327/170; 327/270; 327/276
(58) Field of Classification Search .......... 327/161, 327/270–272, 276–278, 170
See application file for complete search history.

(56) References Cited

U.S. PATENT DOCUMENTS

| | | | | |
|---|---|---|---|---|
| 4,514,647 A * | 4/1985 | Shoji | ............... | 327/161 |
| 5,300,828 A | 4/1994 | McClure | ............... | 326/17 |
| 5,343,099 A * | 8/1994 | Shichinohe | ............... | 327/108 |
| 5,440,277 A * | 8/1995 | Ewen et al. | ............... | 331/176 |
| 5,481,228 A * | 1/1996 | Badyal | ............... | 331/74 |
| 5,686,855 A * | 11/1997 | Lee | ............... | 327/378 |
| 5,703,541 A * | 12/1997 | Nakashima | ............... | 331/57 |
| 5,717,343 A | 2/1998 | Kwong | ............... | 326/27 |
| 5,949,259 A | 9/1999 | Garcia | ............... | 327/111 |
| 5,963,047 A | 10/1999 | Kwong et al. | ............... | 326/27 |
| 6,137,334 A * | 10/2000 | Miller et al. | ............... | 327/271 |
| 6,188,293 B1 * | 2/2001 | Miyagi et al. | ............... | 331/57 |
| 6,351,191 B1 * | 2/2002 | Nair et al. | ............... | 331/57 |
| 6,529,036 B1 | 3/2003 | Rai | ............... | 326/30 |
| 6,549,052 B2 * | 4/2003 | Okayasu | ............... | 327/276 |
| 6,624,679 B2 * | 9/2003 | Tomaiuolo et al. | ............... | 327/262 |
| 6,879,196 B2 * | 4/2005 | Lutkemeyer | ............... | 327/161 |
| 6,928,128 B1 * | 8/2005 | Sidiropoulos | ............... | 375/376 |
| 6,933,759 B1 * | 8/2005 | Wu et al. | ............... | 327/172 |
| 7,180,794 B2 * | 2/2007 | Matsue | ............... | 365/189.09 |

* cited by examiner

*Primary Examiner*—Kenneth B. Wells
(74) *Attorney, Agent, or Firm*—Hogan & Hartson LLP

(57) ABSTRACT

An output circuit comprises an input node, an output node, a first output transistor, a second output transistor, a first slew rate control circuit, and a second slew rate control circuit. The first output transistor and the second output transistor are coupled in series. The first slew rate control circuit is coupled between the first output transistor and a first power supply terminal. The second slew rate control circuit is coupled between the second output transistor and a second power supply terminal. The input node is coupled to gates of the first output transistor and the second output transistor. The output node is coupled to a common node of the first output transistor and the second output transistor.

23 Claims, 9 Drawing Sheets

SLEW RATE CONTROLLED OUTPUT CIRCUIT

FIELD OF THE INVENTION

The present invention relates to an output circuit, and more particularly to a slew rate controlled output circuit.

BACKGROUND

Electronic devices such as personal computers usually include a plurality of integrated circuit (IC) or semiconductor chips that communicate with each other, for example, via a common bus. Each IC chip has an output circuit (also called an "output buffer") to drive signals from the IC chip onto the bus, or alternately, directly onto one or more other IC chips. The speed at which an output circuit switches a signal from logic low to logic high, for example, is known as the slew rate of the output circuit, which is typically measured in volts per unit of time. In order to ensure circuit speed compatibility between IC chips and associated buses, the output circuits used in IC chips are typically selected to have a slew rate within a specified range. If an output circuit does not meet the slew rate specification, its host IC chip may not operate at the specified frequency, and may become incompatible with other chips or devices. The extent of symmetry of rising and falling slew rates may also affect. Further, if the slew rate is too high, undesirable noise may be introduced into the output signal. As a result, it is important for the output drivers to maintain the specified rising and falling slew rates.

The slew rates of an output circuit may vary due to variations in the manufacturing process, variations in operating voltage, variations in operating temperature, and variations in the external load capacitance at the output terminal. As the physical dimensions of IC chips become smaller, it becomes more difficult to control the operating characteristics such as slew rates of the chip's transistors. Process variations in the fabrication of semiconductor chips may cause transistors of the same design to behave differently. For example, the amount of current provided by a transistor, which affects its slew rate, is dependent upon a number of factors including transistor size, gate-to-source voltage, and manufacturing-related parameters. Although transistor size and gate-to-source voltage may be well controlled, manufacturing process characteristics typically vary between transistors because of imperfections in available doping technologies and in other manufacturing technologies. As a result, output circuits of the same design and having the same specified operating characteristics may undesirably operate at different speeds and may have slew rates different from those specified.

Further, transistor operating characteristics vary with changes in temperature. Transistors can operate more slowly as the IC chip heats up and, conversely, can operate more quickly as the IC chip cools down. As a result, the slew rate of conventional output circuits undesirably varies with temperature. Changes in the operating temperature of an output driver may cause the output driver's slew rate to drift from its specified slew rate.

Thus, there is a need for an improved output circuit that maintains a specified and preferably symmetric slew rate despite process, voltage, and temperature variations.

SUMMARY OF THE PREFERRED EMBODIMENTS

An output circuit comprises an input node, an output node, a first output transistor, a second output transistor, a first slew rate control circuit, and a second slew rate control circuit. The first output transistor and the second output transistor are coupled in series. The first slew rate control circuit is coupled between the first output transistor and a first power supply terminal. The second slew rate control circuit is coupled between the second output transistor and a second power supply terminal. The input node is coupled to gates of the first output transistor and the second output transistor. The output node is coupled to a common node of the first output transistor and the second output transistor.

BRIEF DESCRIPTION OF THE DRAWINGS

A more complete understanding of the present invention can be obtained by reference to the detailed description of embodiments in conjunction with the accompanying drawings, which form part of the disclosure. These drawings depict only a typical embodiment of the invention and do not therefore limit its scope. They serve to add specificity and details, in which.

DETAILED DESCRIPTION

Figure 1:
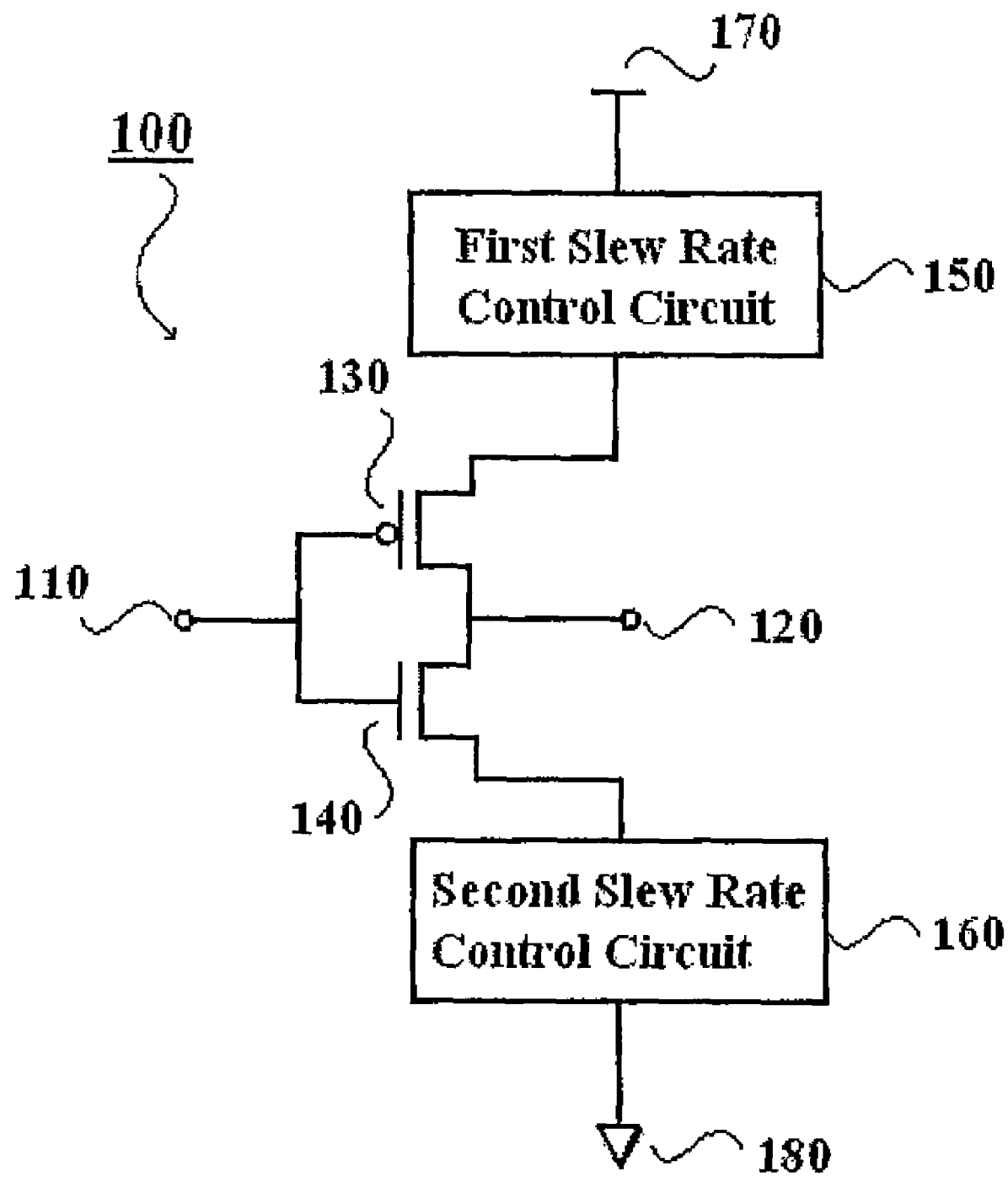
FIG. 1 is a schematic diagram of an exemplary embodiment of an output circuit.

As shown in FIG. 1, an exemplary embodiment of an output circuit 100 comprises an input node 110, an output node 120, a first output transistor 130, a second output transistor 140, a first slew rate control circuit 150, and a second slew rate control circuit 160. The first output transistor 130 and the second output transistor 140 are coupled in series. The first slew rate control circuit 150 is coupled between the first power supply terminal 170 and the first output transistor 130. The second slew rate control circuit 160 is coupled between the second output transistor 140 and the second power supply terminal 180. The input node 110 is coupled to gates of the first output transistor 130 and the second output transistor 140. The output node 120 is coupled to a common node of the first output transistor 130 and the second output transistor 140.

When an output voltage switches from a high level to a low level or from a low level to a high level, both the first output transistor 130 and the second output transistor 140 turn on and work in a saturation region. A resistance of the first output transistor 130 and the second output transistor 140 affects a rising slew rate and falling slew rate. Because of process, supply voltage, and temperature variations, the electrical characteristics such as resistance of the first output transistor 130 and the second output transistor 140 vary. As a result, a rising slew rate and a falling slew rate of the output voltage from the output node 120 may not meet a desired range and may not be desirably symmetric.

The first and second slew rate control circuits preferably provide a Variable resistance to compensate for any differences in resistance between the first output transistor 130 and the second output transistor 140. The variable resistances are adjusted to make the equivalent resistance of the first slew rate control circuit 150 and the first output transistor 130 (collectively the upper part of the output circuit shown in FIG. 1) substantially the same as that of the second slew rate control circuit 160 and the second output transistor 140 (collectively the lower part of the output circuit shown in FIG. 1). For example, if the resistance of the first output transistor 130 is higher than that of the second output transistor 140, the variable resistance of the first slew rate control circuit is adjusted to be lower than that of the second slew rate control circuit to compensate for the difference in resistance between the first and the second output transistors 130 & 140. Because the upper part and the lower part of the output circuit 100 have substantially the same resistance, the rising slew rate is substantially the same as the falling slew rate. As a result, the transitions of the output voltage from a high level to a low level and from a low level to a high level are symmetric.

Because the variable resistances of the first slew rate control circuit 150 and the second flew rate control circuit 160 are dynamically adjusted in response to supply voltage and temperature variations, the resistance of the upper part of the output circuit 100 remains substantially the same as that of the lower part of the output circuit 100 over these variations. As a result, the rising slew rate and the falling slew rate remain symmetric over these variations.

In one embodiment, the first output transistor 130 is a PMOS transistor and the second output transistor 140 is an NMOS transistor. The first power supply terminal provides a positive voltage VDD and the second power supply terminal provides a ground voltage to the output circuit 100. A source of the PMOS transistor 130 is coupled to the first slew rate control circuit 150. The output node 120 is coupled to the drains of the PMOS transistor 130 and the NMOS transistor 140. A source of the NMOS transistor 140 is coupled to the second slew rate control circuit 160. The input node 110 of the output circuit 100 is coupled to gates of the PMOS transistor 130 and the NMOS transistor 140. In other embodiments, the first output transistor 130 and the second output transistor 140 can be other types of transistors. The second power supply terminal 180 may provide a positive voltage lower than that provided by the first power supply terminal 170 or may provide a negative voltage.

Figure 2:
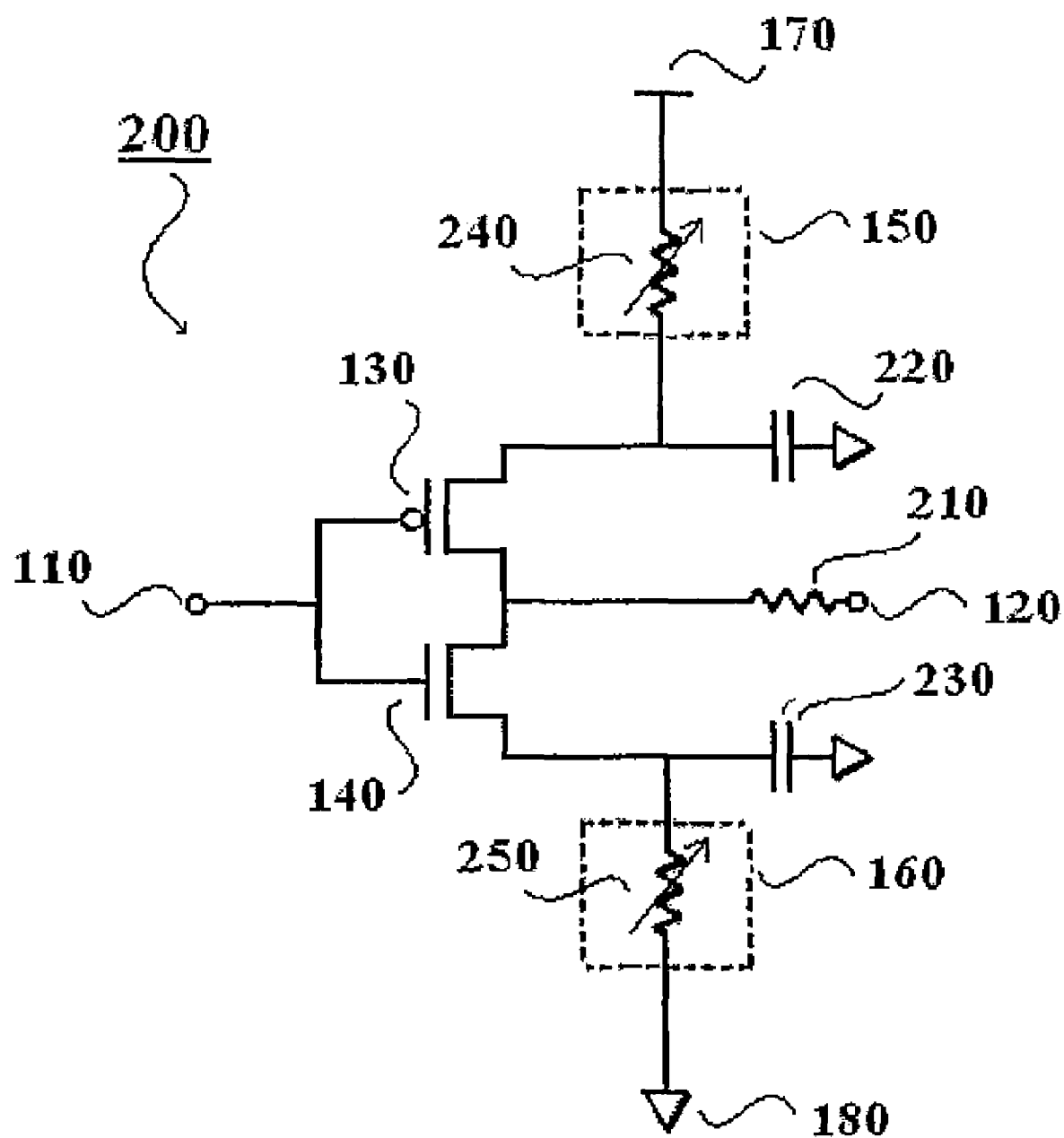
FIG. 2 is a schematic diagram of another embodiment of an output circuit.

FIG. 2 shows another embodiment of an output circuit 200 which further comprises an output resistor 210 and two capacitors 220 and 230. In addition, the first slew rate control circuit 150 comprises a first variable resistance 240 and the second slew rate control circuit 160 comprises a second variable resistance 250. The first variable resistance 240 is adjusted according to a first bias signal from a first bias circuit. The second variable resistance 250 is adjusted according to a second bias signal from a second bias circuit. The output resistor 210 is coupled between the output node 120 and the common node of the first output transistor 130 and the second output transistor 140. The output resistor 210 can mitigate signal reflection and distortion caused by any impedance mismatch between the output circuit 200 and the external loading circuit.

In the FIG. 2 circuit, a first capacitor 220 is coupled to the second power supply terminal 180 and a common node of the first output transistor 130 and the first variable resistance 240. A second capacitor 230 is coupled to the second power supply terminal 180 and a common node of the second output transistor 140 and the second variable resistance 250. The first capacitor 220 and the second capacitor 230 may improve the symmetry of an output rising and falling slew rate but may also slow down the circuit's operation speed.

In one embodiment, the first output transistor 130 is a PMOS transistor and the second output transistor 140 is an NMOS transistor. The first power supply terminal 170 provides a positive voltage VDD and the second power supply terminal 180 provides a ground voltage to the output circuit 100. One end of the output resistor 210 is coupled to the output node 120. The other end of the output resistor 210 is coupled to drain ends of the PMOS transistor 130 and the NMOS transistor 140. One end of the first capacitor 220 is coupled to the ground voltage. The other end of the first capacitor 220 is coupled to the first variable resistance 240 and the source end of the PMOS transistor 130. One end of the second capacitor 230 is coupled to the ground voltage. The other end of the second capacitor 230 is coupled to the second variable resistance 250 and the source end of the NMOS transistor 140.

Figure 3:
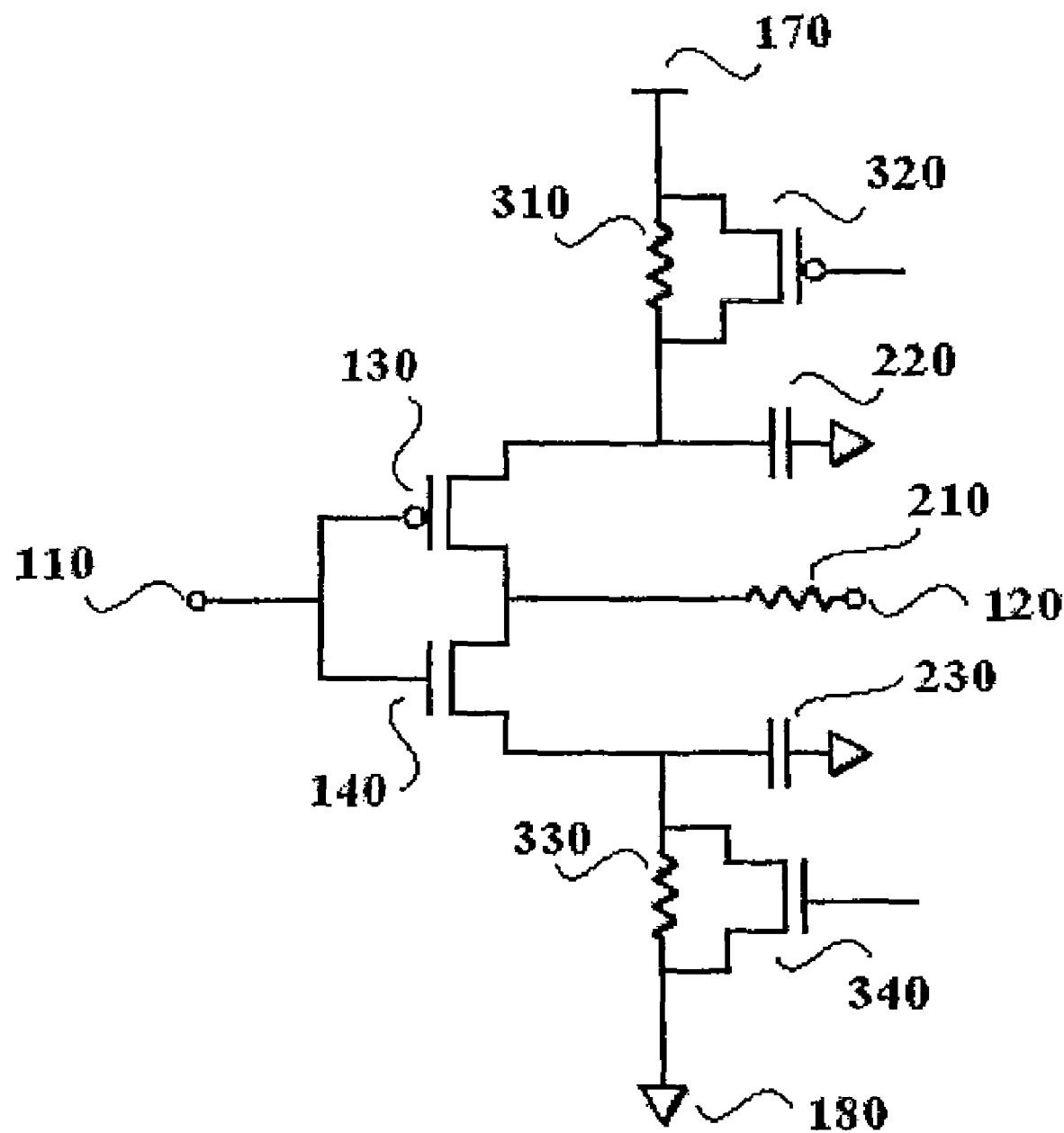
FIG. 3 is a schematic diagram of the output circuit shown in FIG. 2, where a variable resistance is implemented by a resistor and a transistor coupled in parallel.

As shown in FIG. 3, a first embodiment of the first variable resistance 240 contains a first resistor 310 and a first control transistor 320 coupled in parallel. A gate of the first control transistor 320 is coupled to a first bias signal node of a first bias circuit. Similarly, a first embodiment of the second variable resistance 250 contains a second resistor 330 and a second control transistor 340 coupled in parallel. A gate of the second control transistor 340 is coupled to a second bias signal node of a second bias circuit.

The first resistor 310 and the first control transistor 320 are coupled in parallel to perform the function of the variable resistance 240. The larger resistance the first resistor 310 has, the wider adjustable range the first variable resistance has. The gate of first control transistor 320 receives the first bias signal from the first bias circuit to control the amount of current respectively flowing through the first control transistor 320 and the first resistor 310 that provide a desired equivalent resistance. The same operation principle applies to the second resistor 330 and the second control transistor 340.

Due to variations in the semiconductor manufacturing process, the first output transistor 130 may operate with a lower resistance than the second output transistor 140. The voltage of the first bias signal preferably is then made higher to increase the resistance of the first variable resistance 240. The voltage of the second bias signal preferably is then made higher to reduce the resistance of the second variable resistance 250. As a result, the equivalent resistance of the first output transistor 130 and the first variable resistance 240 preferably are substantially the same as that of the second output transistor 140 and the second variable resistance 250 over the process variation.

When an operation temperature rises, the resistance of the first output transistor 130 goes up. In response to the temperature change, the first bias circuit preferably lowers the voltage of the first bias signal that in turns lowers the resistance of the first variable resistance 240. Similarly, the resistance of the second output transistor 140 also goes up because of the rise of the operation temperature. Also in response to the temperature change, the second bias circuit preferably increases the voltage of the second bias signal that in turns lowers the resistance of the second variable resistance 250. As a result, the equivalent resistance of the first output transistor 130 and the first variable resistance 240 remains substantially the same as that of the second output transistor 140 and the second variable resistance 250 over the temperature variation.

When a supply voltage of the first power supply terminal rises, the resistance of the first output transistor 130 typically goes down because its operating speed increases. In response to the supply voltage change, the first bias circuit preferably increases the voltage of the first bias signal that in turns increases the resistance of the first variable resistance 240. Similarly, the resistance of the second output transistor 140 typically also goes down in response to an increase in the supply voltage. Preferably then, in response to the voltage change, the second bias circuit lowers the voltage of the second bias signal to increase the resistance of the second variable resistance 250. As a result, the equivalent resistance of the first output transistor 130 and the first variable resistance 240 remains substantially the same as that of the second output transistor 140 and the second variable resistance 250 over the supply voltage variation.

In one embodiment, the first output transistor 130 and the first control transistor 320 are PMOS transistors. The second output transistor 140 and the second control transistor 340 are NMOS transistors. First power supply terminal 170 provides a positive voltage VDD and second power supply terminal 180 provides a ground voltage. A source of the PMOS transistor 320 is coupled to one end of the first resistor 310 and the VDD. A drain of the PMOS transistor 320 is coupled to the other end of the first resistor 310, the source of the PMOS transistor 130 and one end of the first capacitor 220. A source of the NMOS transistor 340 is coupled to one end of the second resistor 330 and the ground. A drain of the NMOS transistor 340 is coupled to the other end of the second resistor 330, the source of the NMOS transistor 140 and one end of the second capacitor 230.

When the gate of the PMOS transistor 320 receives a lower voltage of the first bias signal, the PMOS transistor 320 turns on more. More current flows through the PMOS transistor 320. The resistance of the first variable resistance 240 decreases. When the gate of the PMOS transistor 320 receives a higher voltage of the first bias signal, the PMOS transistor 320 turns on less. Less current flows through the PMOS transistor 320. The resistance of the first variable resistance 240 increases. When the gate of the NMOS transistor 340 receives a lower voltage of the second bias signal, the NMOS transistor 340 turns on less. Less current flows through the NMOS transistor 340. The resistance of the second variable resistance 250 increases. When the gate of the NMOS transistor 340 receives a higher voltage of the second bias signal, the NMOS transistor 340 turns on more. More current flows through the NMOS transistor 340. The resistance of the second variable resistance 250 decreases.

Figure 4:
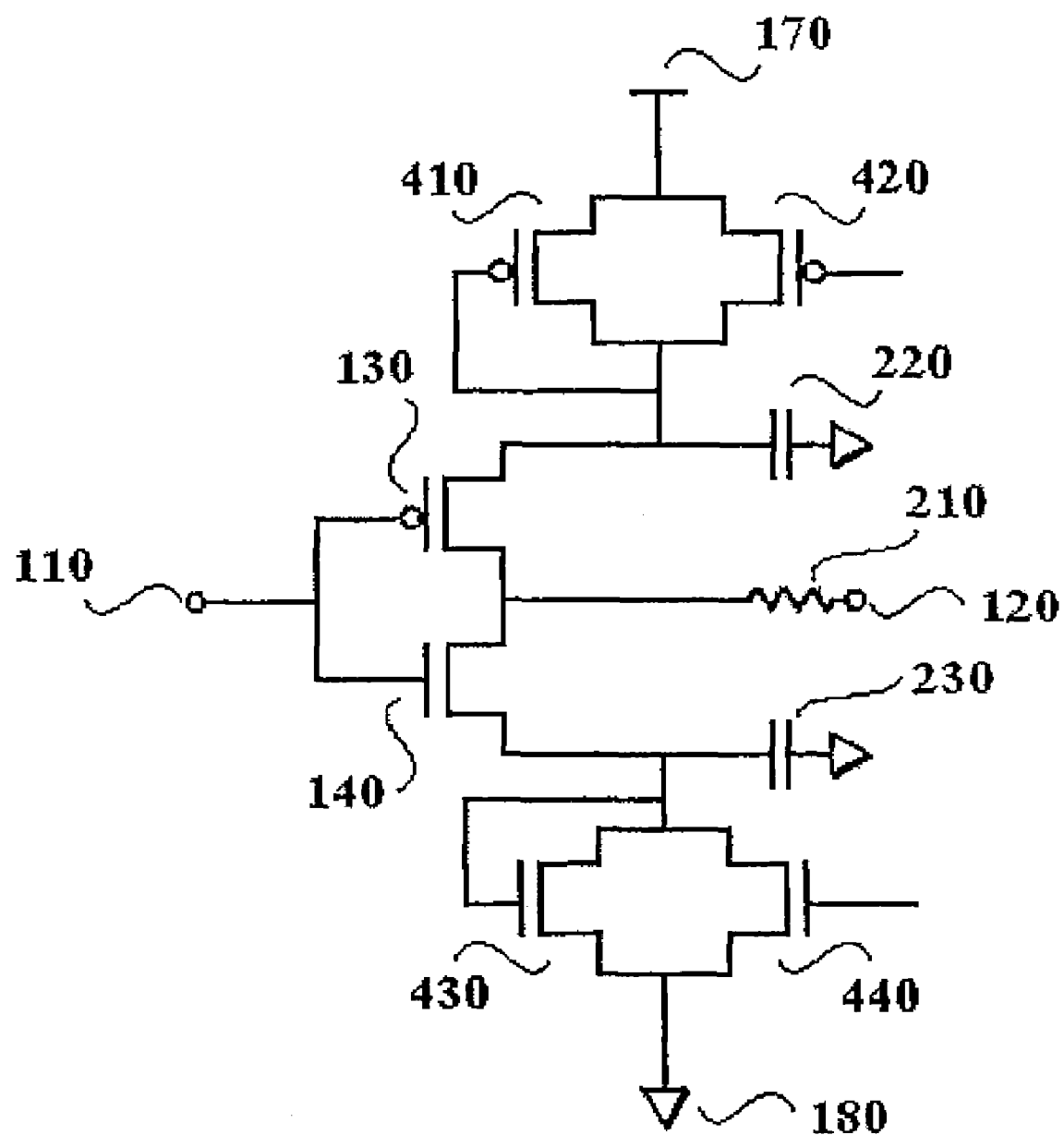
FIG. 4 is a schematic diagram of the output circuit shown in FIG. 2, where a variable resistance is implemented by two transistors coupled in parallel.

FIG. 4 shows a second embodiment of the first variable resistance 240 and the second variable resistance 250. Here, the first variable resistance 240 contains a first control transistor 410 and a second control transistor 420 coupled in parallel and the second variable resistance 250 contains a third control transistor 430 and a fourth control transistor 440 coupled in parallel. People in the art appreciate various other ways to implement the first variable resistance 240 and the second variable resistance 250.

The first control transistor 410 and the second control transistor 420 are coupled in parallel to perform the function of the first variable resistance 240. The gate of second control transistor 420 receives the first bias signal from the first bias circuit to control the amounts of current respectively flowing through the first control transistor 410 and the second control transistor 420 that result in a desired equivalent resistance. The same operation principle applies to the third control transistor 430 and the fourth control transistor 440.

In one embodiment, both the first control transistor 410 and the second control transistor 420 are PMOS transistors. Both the third control transistor 430 and the fourth control transistor 440 are NMOS transistors. First power supply terminal 170 provides a positive voltage VDD and second power supply terminal 180 provides a ground voltage. Sources of the PMOS transistors 410 and 420 are coupled to the VDD. Drains of the PMOS transistors 410 and 420, and a gate of the PMOS transistor 410 are coupled to the first output transistor 130. A gate of the PMOS transistor 420 is coupled to a first bias signal node of the first bias circuit. Similarly, for the second variable resistance, drains of the NMOS transistors 430 and 440 are coupled to the second output transistor 140. Sources of the NMOS transistors 430 and 440 are coupled to the ground. A gate of the NMOS transistor 430 is coupled to the second output transistor 140. A gate of the NMOS transistor 440 is coupled to a second bias signal node of the second bias circuit.

A first PMOS transistor 410 works as a resistor when the $V_{DS} > V_{Pth}$ ($V_{DS}$ is a voltage across drain and source of the PMOS transistor, $V_{Pth}$ is a threshold voltage of the PMOS transistor) and turns off when the $V_{DS} < V_{Pth}$. A second PMOS transistor 420 works as a resistor when the $V_{DS} < V_{Pth}$ and has a very large resistance $V_{DS} > V_{Pth}$. Thus, the first PMOS transistor 410 and the second PMOS transistor 420 coupled in parallel work as a resistor variable on the first bias signal over the whole range of the voltage. The same principle applies to a first NMOS transistor 430 and a second NMOS transistor 440.

The first bias circuit and the second bias circuit function as a sensor to process, voltage supply, and temperature variations. In response to PVT variations that change the resistance of the first output resistor 130 and the second output resistor 140, the first bias circuit adjusts the first bias signal sent to control the first variable resistance 240 and the second bias circuit adjusts the second bias signal to control the second variable resistance 250. As a result, the equivalent resistance of the first variable resistance 240 and the first output transistor 130 remains to be substantially the same as that of the second variable resistance 250 and the second output transistor 140.

Figure 5:
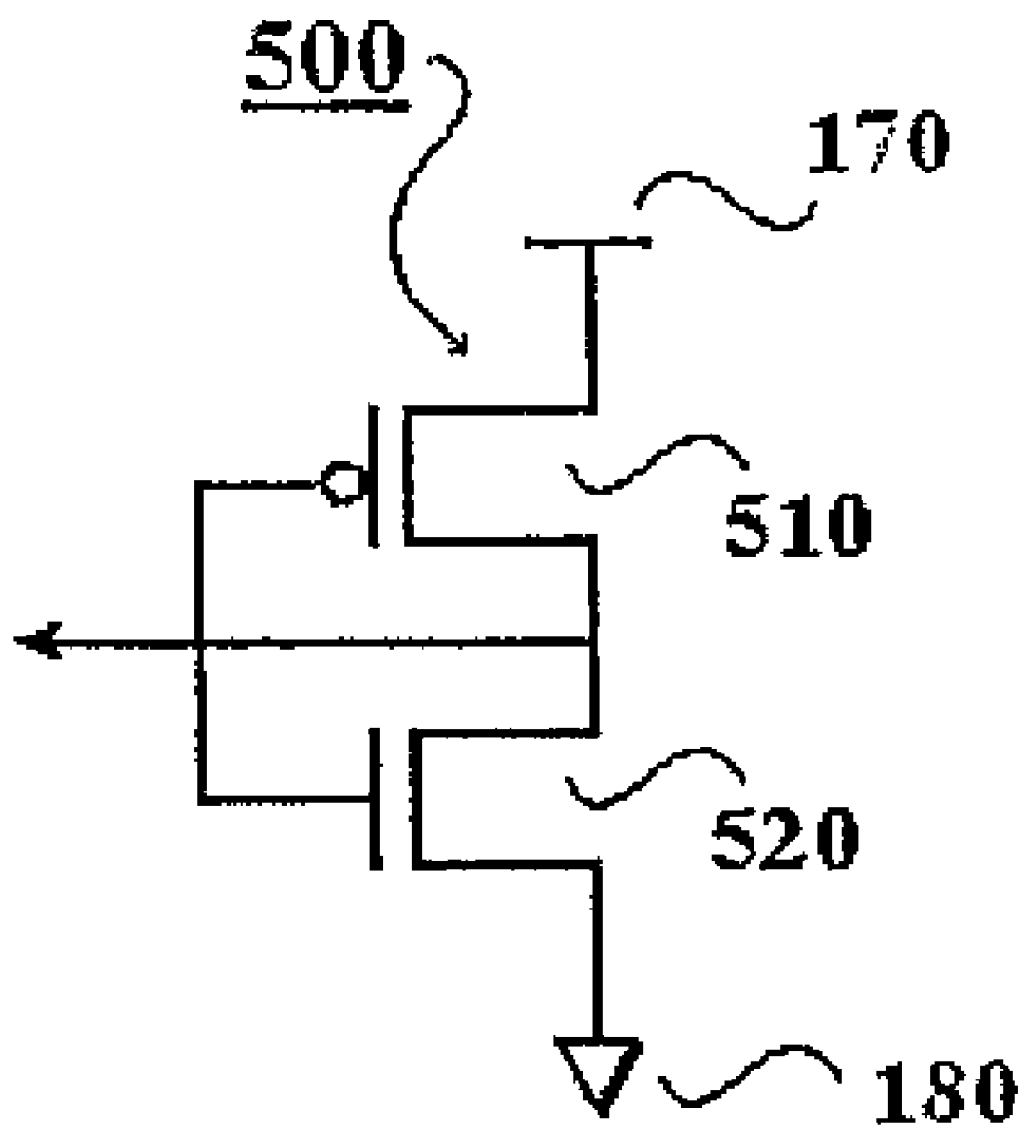
FIG. 5 is a schematic diagram of a first embodiment of a bias circuit.

FIG. 5 shows a first embodiment of the bias circuit 500 which provides the same bias signal to control the first variable resistance 240 and the second variable resistance 250. Thus, a common bias signal node is used for the first bias signal node and the second bias signal node. The bias circuit 500 comprises a first bias transistor 510 and a second bias transistor 520 connected in series across the first and the second power supply terminals 170, 180. The first bias signal node and the second bias signal node are coupled to gates of the first bias transistor 510 and the second bias transistor 520 and a common node of the first bias transistor 510 and the second bias transistor 520. In addition, the electrical characteristics of the first bias transistor 510 and the second bias transistor 520 are respectively substantially the same as those of the first output transistor 130 and the second output transistor 140.

In one implementation of the first embodiment, the first bias transistor 510 is a PMOS transistor and the second bias transistor 520 is an NMOS transistor. First power supply terminal 170 provides a positive voltage VDD and second power supply terminal 180 provides a ground voltage. A source of the PMOS transistor 510 is coupled to the power supply VDD. A source of the NMOS transistor 520 is coupled to the ground. Gates and drain of the PMOS transistor 510 and the NMOS transistor 520 are coupled to the common bias signal node.

Due to the resemblance of their characteristics, if the PMOS transistor 130 works with a lower resistance than the NMOS transistor 140, the PMOS transistor 510 also works with the same lower resistance than the NMOS transistor 520. The voltage of the bias signal from the bias circuit 500 is higher than VDD/2. The higher voltage of the bias signal makes the first variable resistance 240 (a PMOS transistor included) lower and makes the second variable resistance 250 (an NMOS transistor included) higher. As a result, the equivalent resistance of the PMOS transistor 130 and the first variable resistance 240 is substantially the same as that of the NMOS transistor 140 and the second variable resistance 250 over the process variations.

When the temperature or voltage supply rises which causes different changes on the resistance of the first output transistor 130 and the second output transistor 140, the adjusted bias signal can alter the first variable resistance 240 and the second variable resistance 250 to compensate for the resistance difference between the first output transistor 130 and the second output transistor 140.

Figure 6A:
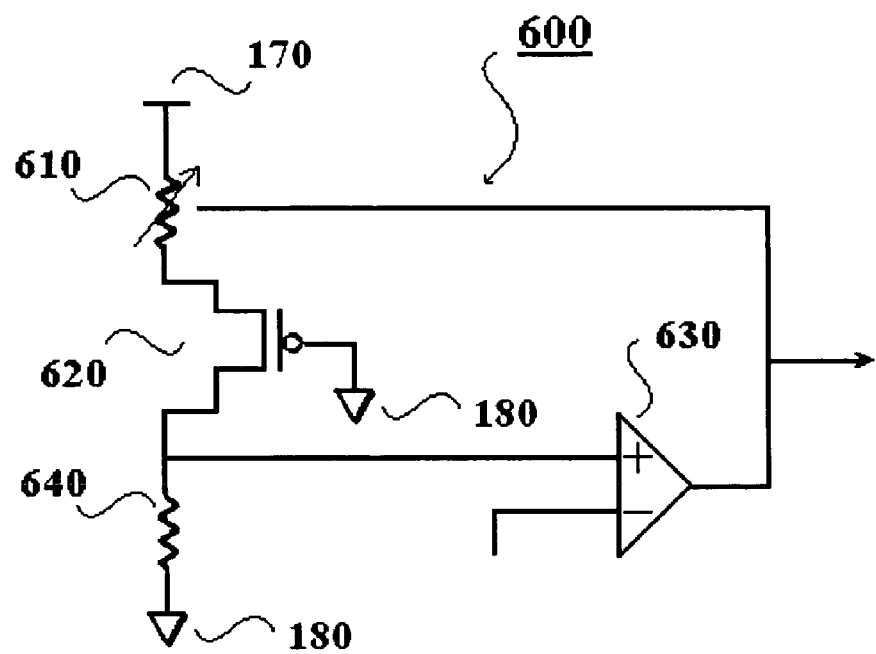
FIGS. 6A & 6B are schematic diagrams of a second embodiment of bias circuits.
Figure 6B:
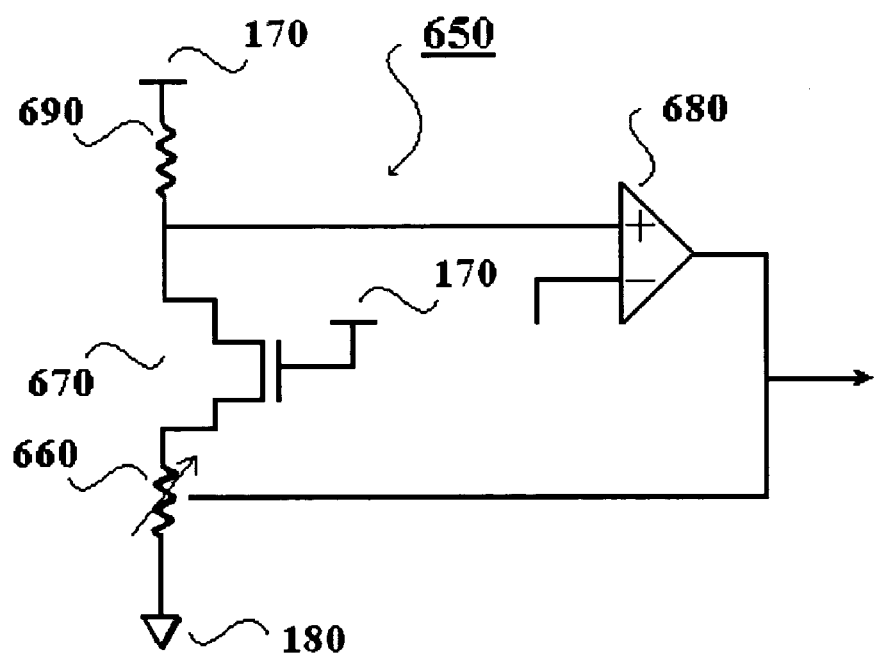

The second embodiment of the first bias circuit and the second embodiment circuit as shown in FIGS. 6A & 6B respectively provides the first bias signal and the second bias signal. These two separate bias signals can more precisely control and maintain the first slew rate and the second slew rate over the process, voltage supply, and temperature variations through the negative feedback function of an operational amplifier.

FIG. 6A & 6B show a second embodiment of the first bias circuit 600 and the second bias circuit 650. The first bias circuit 600 comprises a first bias variable resistance 610, a first bias transistor 620, a first bias operational amplifier 630, and a rising slew rate control resistor 640. A first end of the first bias variable resistance 610 is coupled to the first power supply terminal 170. A second end of the first bias variable resistance 610 is coupled to a first end of the first bias transistor 620. The second end of the first bias transistor 620 is coupled to a positive input end of the first bias operational amplifier 630 and one end of the rising slew rate control resistor 640. The other end of the rising slew rate control resistor 640 is coupled to the second power supply terminal 180. A gate of the first bias transistor 620 is coupled to the second power supply terminal 180. A negative input end of the first bias operational amplifier 630 is coupled to a power supply terminal whose voltage is an average of the first power supply terminal 170 and the second power supply terminal 180. An output of the first bias operational amplifier 630 is coupled to an adjusting terminal of the first bias variable resistance 610 and the first bias signal node. In addition, the electrical characteristics of the first bias variable resistance 610 and the first bias transistor 620 are respectively substantially the same as those of the first variable resistance 240 of the first slew rate control circuit and the first output transistor 130.

Similarly, the second bias circuit 650 comprises a second bias variable resistance 660, a second bias transistor 670, a second bias operational amplifier 680, and a falling slew rate control resistor 690. One end of the falling slew rate control resistor 690 is coupled to the first power supply terminal 170. The other end of the falling slew rate control resistor 690 is coupled to a positive input end of the second bias operational amplifier 680 and a first end of the second bias transistor 670. A negative input end of the second bias operational amplifier 680 is coupled to a power supply terminal whose voltage is an average of the first power supply terminal 170 and the second power supply terminal 180. A second end of the second bias transistor 670 is coupled to a first end of the second bias variable resistance 660. A gate of the second bias transistor 670 is coupled to the first power supply terminal 170. A second end of the second bias variable resistance 660 is coupled to the second power supply terminal 180. An adjusting terminal of the second bias variable resistance 660 is coupled to an output end of the second bias operational amplifier 680 and the second bias signal node. In addition, the electrical characteristics of the second bias variable resistance 660 and the second bias transistor 670 are respectively substantially the same as those of the second variable resistance 250 in the second slew rate control circuit and the second output transistor 140. Moreover, the rising slew rate control resistor 640 has substantially the same resistance as the falling slew rate control resistor 690.

As mentioned before, the resistance (R) of the rising and falling slew rate control resistors 640, 690 is determined by a desired rising time ($\tau$) of an output circuit and a capacitance ($C_L$) of a loading circuit.

For a first order system, $R \sim \tau/C_L$.

For example, assuming the desired rising time is 200 ps and the loading capacitance is 10 pf, the resistance of the balance resistors is 20 ohms. The rising slew rate is the voltage difference approximately from logic low to logic high divided by the desired rising time.

Because of the negative feedback function of the first bias operational amplifier 630, the equivalent resistance of the first bias variable resistance 610 and the first bias transistor 620 is maintained to be substantially the same as the equivalent resistance of the rising slew rate control resistor 640. The rising slew control resistor 640 has a fixed resistance as desired. In response to the resistance change of the first bias transistor 620 due to PVT variations, the first bias variable resistance 610 is adjusted to ensure that the equivalent resistance of the first bias variable resistance 610 and the first bias transistor 620 remains the same. In addition, the first bias variable resistance 610 simulates the first variable resistance 240 of the first slew rate control circuit. The first bias transistor 620 simulates the first output transistor 130. Through the first bias signal generated from the first bias operational amplifier 630, the equivalent resistance of the first variable resistance 240 and the first output transistor 130 is substantially the same as that of the first bias variable resistance 610 and the first bias transistor 620. As a result, the rising slew rate remains substantially constant over the PVT variations. The same principle is applied to the second bias circuit. By setting the resistance of the rising slew rate control resistor 640 to be substantially the same as that of the falling slew rate control resistor 690, the rising slew rate and the falling slew rate of the output voltage should be the same and symmetric to each other.

For the second embodiment of the first and second bias circuits 600 & 650 as shown in FIGS. 6A & 6B, people in the art appreciate that the first bias variable resistance 610 and the second bias variable resistance 660 can be implemented in many different ways as long as they respectively simulate the first variable resistance 240 of the first slew rate control circuit and the second variable resistance 250 of the second slew rate control circuit.

Figure 7A:
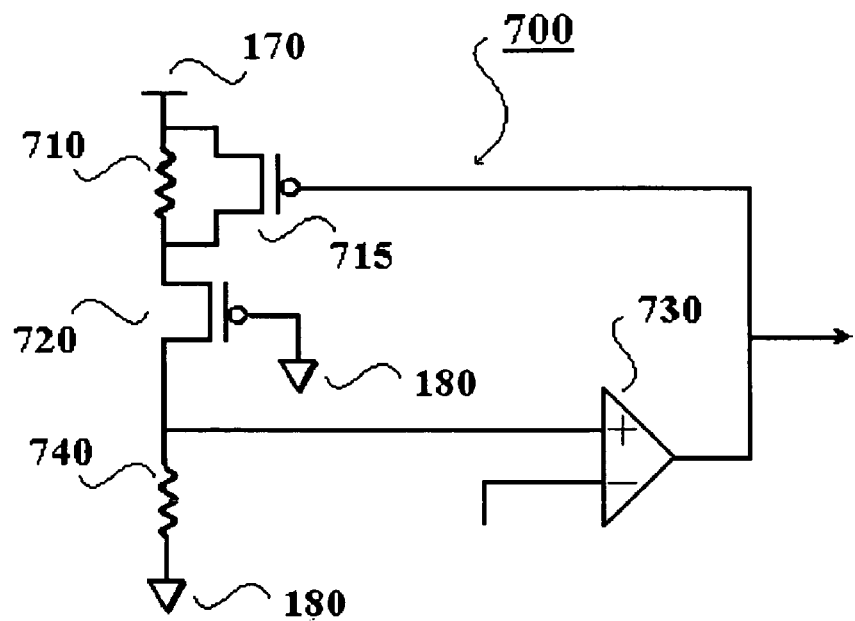
FIGS. 7A & 7B are schematic diagrams of the bias circuits shown in FIGS. 6A & 6B, where a variable resistance is implemented by a resistor and a transistor coupled in parallel.
Figure 7B:
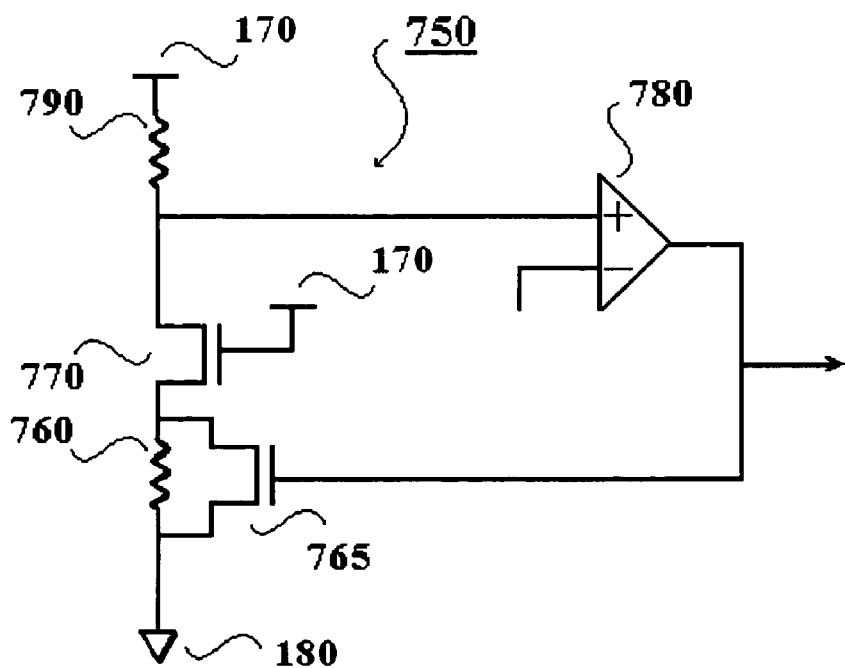

FIG. 7A shows that the first bias variable resistance 610 may comprise a first bias resistor 710 and a first adjustment transistor 715 that are implemented to operate like the first embodiment of the first variable resistance 240 of the first slew rate control circuit, which comprises the first resistor 310 and the first control transistor 320. FIG. 7B illustrates that the second bias variable resistance 660 may comprise a second bias resistor 760 and a second adjustment transistor 765 that are implemented to operate like the first embodiment of the second variable resistance 250 of the second slew rate control circuit, which comprises the second resistor 330 and the second control transistor 340.

In one embodiment, first adjustment transistor 715 and the first bias transistor 720 are preferably PMOS transistors. Second adjustment transistor 765 and the second bias transistor 770 are preferably NMOS transistors. First power supply terminal 170 provides a positive voltage VDD and second power supply terminal 180 provides a ground voltage. The first bias resistor 710, the PMOS transistor 720 and the rising slew rate control resistor 740 are coupled in series across the power supply (VDD) and ground. A gate of the PMOS transistor 720 is coupled to ground. The PMOS transistor 715 is coupled in parallel to the first bias resistor 710. A positive input end of the first bias operational amplifier 730 is coupled to a common node of the PMOS transistor 720 and the rising slew rate control resistor 740. A negative input end of the first bias operational amplifier 730 is coupled to a power supply with a reference voltage of VDD/2. An output of the first bias operational amplifier 730 is coupled to a gate of the PMOS transistor 715 and the first bias signal node.

The falling slew rate control resistor 790, the NMOS transistor 770, and the second bias resistor 760 are coupled in series across the power supply (VDD) and ground. A gate of the NMOS transistor 770 is coupled to VDD. The NMOS transistor 765 is coupled in parallel to the second bias resistor 760. A positive input end of the second bias operational amplifier 780 is coupled to a common node of the falling slew rate control resistor 790 and the NMOS transistor 770. A negative input end of the second bias operational amplifier 780 is coupled to a power supply with a reference voltage of VDD/2. An output of the second bias operational amplifier 780 is coupled to a gate of the NMOS transistor 765 and the second bias signal node.

Figure 8:
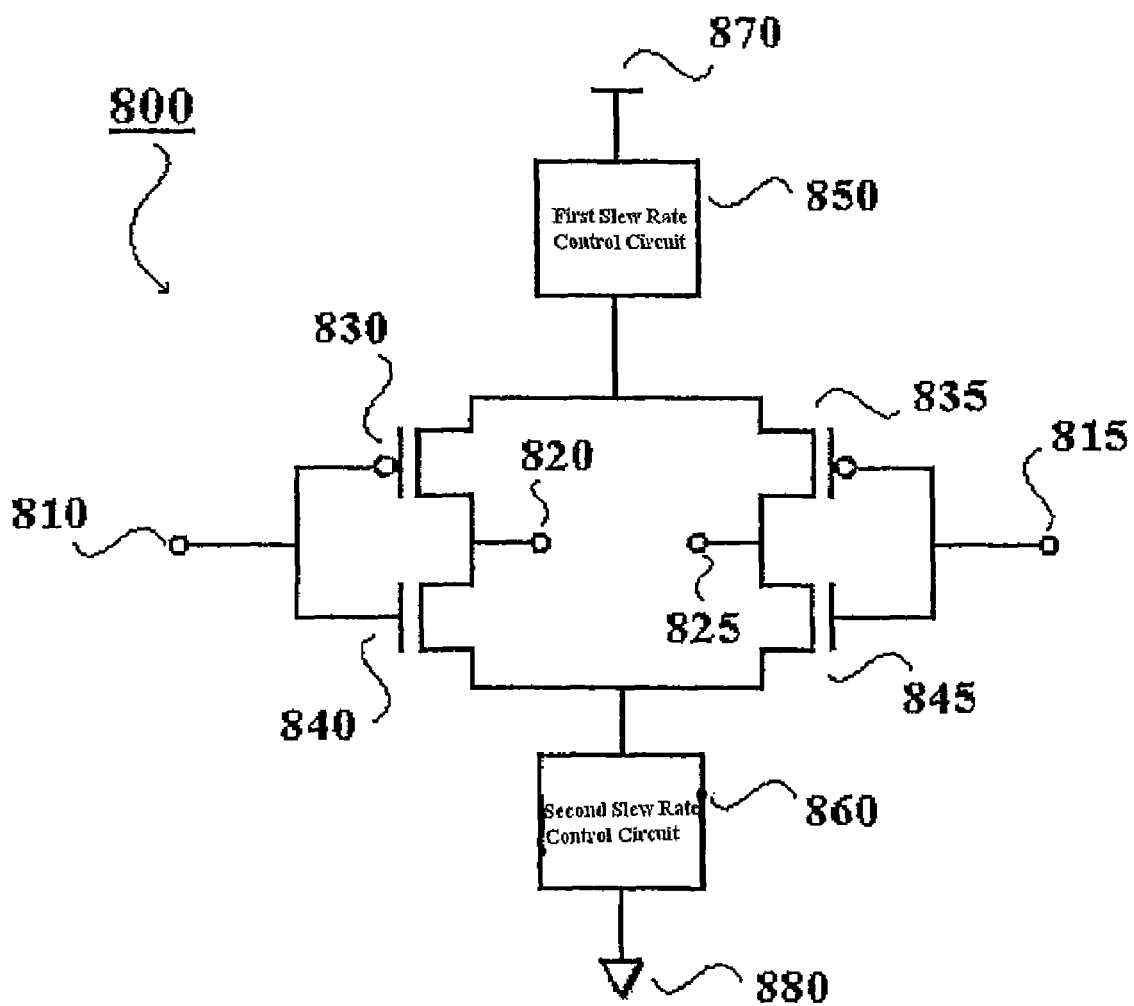
FIG. 8 is a schematic diagram of an exemplary embodiment of an output circuit with differential input and output signals.

FIG. 8 shows an exemplary embodiment of an output circuit 800 with differential input and output signals. The output circuit 800 with differential input and output signals can reduce ground bounce effects caused by the switching of signals. The output circuit 800 comprises an input node 810, an input complementary node 815, an output node 820, an output complementary node 825, a first output transistor 830 and a second output transistor 840 coupled in series, a third output transistor 835 and a fourth output transistor 845 coupled in series, a first slew rate control circuit 850, and a second slew rate control circuit 860. The first slew rate control circuit 850 is coupled between the first power supply terminal 870 and a common node of the first output transistor 830 and the third output transistor 835. The second slew rate control circuit 860 is coupled between a second power supply terminal 880 and a common node of the second output transistor 840 and the fourth output transistor 845. The input node 810 is coupled to gates of the first output transistor 830 and the second output transistor 840. The input complementary node 815 is coupled to gates of the third output transistor 835 and the fourth output transistor 845. The output node 820 is coupled to a common node of the first output transistor 830 and the second output transistor 840. The output complementary node 825 is coupled to a common node of the third output transistor 835 and the fourth output transistor 845.

In one embodiment, the first and third output transistors 830 & 835 are PMOS transistors and the second and fourth output transistors 840 & 845 are NMOS transistors. The input node 810 is coupled to gates of the PMOS transistor 830 and the NMOS transistor 840. The input complementary node 815 is coupled to gates of PMOS transistor 835 and the NMOS transistor 845. The output node 820 is coupled to drains of the PMOS transistor 830 and the NMOS transistor 840. The output complementary node 825 is coupled to drains of the PMOS transistor 835 and the NMOS transistor 845. The first slew rate control circuit is coupled to sources of the PMOS transistors 830 & 835. The second slew rate control circuit is coupled to sources of the NMOS transistors 840 & 845.

Figure 9:
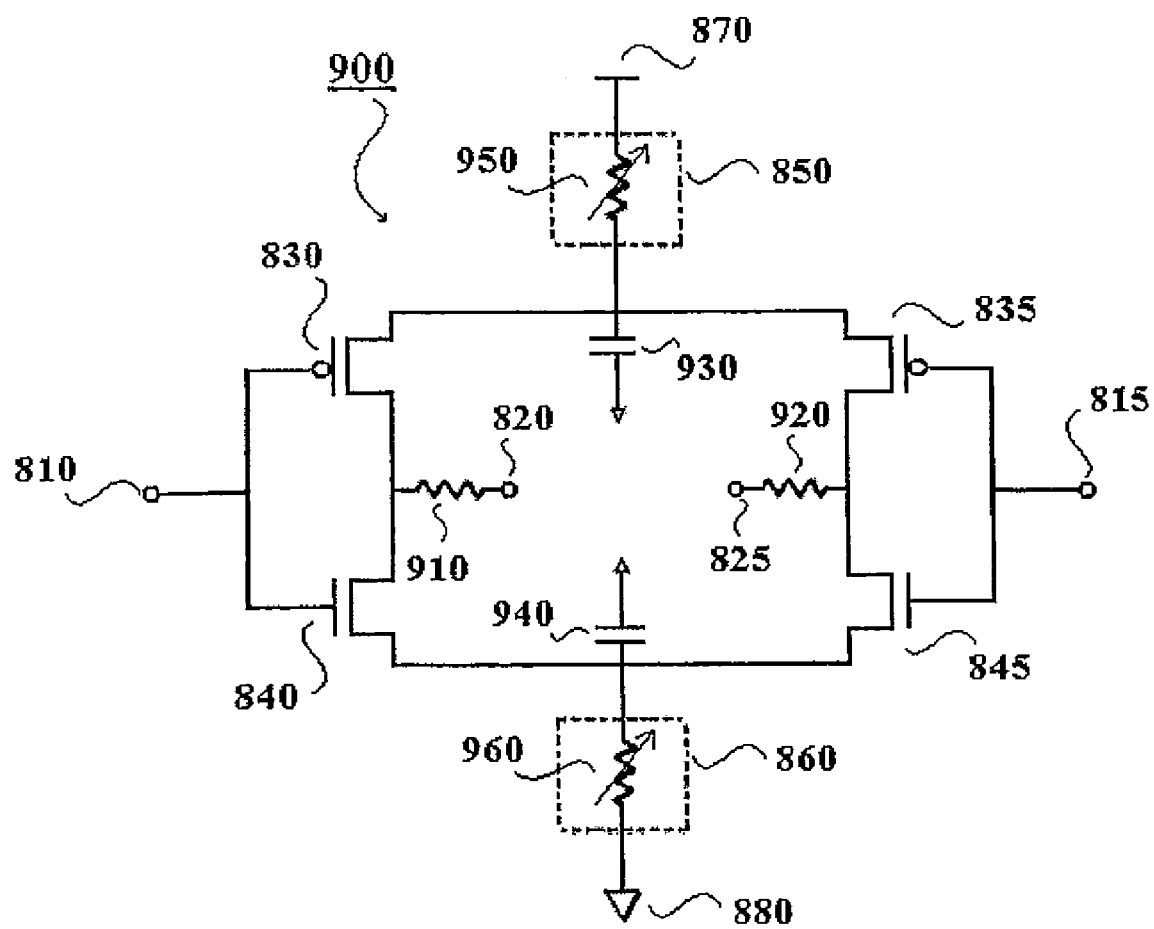
FIG. 9 is a schematic diagram of another embodiment of an output circuit with differential input and output signals.

FIG. 9 shows another embodiment of an output circuit 900 which further comprises first and second output resistors 910 & 920 and first and second capacitors 930 & 940. The first slew rate control circuit 850 comprises a first variable resistance 950 and the second slew rate control circuit 860 comprises a second variable resistance 960. The first output resistor 910 is coupled between the output node 820 and a common node of the first output transistor 830 and the second output transistor 840. The second output resistor 920 is coupled between the output complementary node 825 and a common node of the third output transistor 835 and the fourth output transistor 845. The first and second output resistors 910 & 920 can mitigate the reflection and signal distortion caused by an impedance mismatch between the output circuit and the loading circuit.

In addition, the first capacitor 930 is coupled to the second power supply terminal 880 and a common node of the first output transistor 830, the third output transistor 835, and the first variable resistance 950. The second capacitor 940 is coupled to the second power supply terminal 880 and a common node of the second output transistor 840, the fourth output transistor 845, and the second variable resistance 960. The first and second capacitors 930 & 940 may improve the symmetry of output rising and falling slew rates but may also slow down the circuit's operation speed.

In one embodiment, the first and third output transistors 830 & 835 are PMOS transistors and the second and fourth output transistors 840 & 845 are NMOS transistors. First power supply terminal 870 provides a positive voltage VDD and second power supply terminal 880 provides a ground voltage. One end of the first output resistor 910 is coupled to the output node 820. The other end of the first output resistor 910 is coupled to drains of the PMOS transistor 830 and the NMOS transistor 840. One end of the second output resistor 920 is coupled to the output complementary node 825. The other end of the second output resistor 920 is coupled to drains of the PMOS transistor 835 and the NMOS transistor 845. One end of the first capacitor 930 is coupled to the ground voltage. The other end of the first capacitor 930 is coupled to the first variable resistance 950 and the sources of the PMOS transistors 830 & 835. One end of the second capacitor 940 is coupled to the ground voltage. The other end of the second capacitor 940 is coupled to the second variable resistance 960 and the sources of the NMOS transistors 840 & 845.

The first and second embodiments of the first and second variable resistances 240 & 250 can be used to implement the first and second variable resistance 950 & 960. Similarly, the first and second embodiments of the first bias circuit 500 & 600 and the second bias circuit 500 & 650 can be used to generate the first and second bias signals respectively for the first and second variable resistance 950 & 960.

Although the invention has been described in terms of exemplary embodiments, it is not limited thereto. The described embodiment is to be considered in all respects only as illustrative and not as restrictive. The present invention may be embodied in other specific forms without departing from its essential characteristics. The scope of the invention, therefore, is indicated by the appended claims rather than by the foregoing description. All changes which come within the meaning and range of the equivalents of the claims are to be embraced within their scope.

What is claimed is:

1. An output circuit comprising:
a first output transistor and a second output transistor coupled in series;
an input node coupled to gates of the first output transistor and the second output transistor;
an output node coupled to a common node of the first output transistor and the second output transistor;
a first slew rate control circuit coupled between the first output transistor and a first power supply terminal, and configured to provide a first variable resistance in response to a first bias signal from a first bias circuit, the first slew rate control circuit further comprising a first control transistor and a second control transistor coupled in parallel, a gate of the first control transistor coupled to the first output transistor, a gate of the second control transistor coupled to receive the first bias signal; and
a second slew rate control circuit coupled between the second output transistor and a second power supply terminal, and configured to provide a second variable resistance in response to a second bias signal from a second bias circuit, the second slew rate control circuit further comprising a third control transistor and a fourth control transistor coupled in parallel, a gate of the third control transistor coupled to the second output transistor, a gate of the fourth control transistor coupled to receive the second bias signal;
wherein the first bias circuit comprises a first bias operational amplifier and the second bias circuit comprises a second bias operational amplifier.

2. The circuit of claim 1, wherein a first resistance of the first slew rate control circuit and the first output transistor is substantially the same as a second resistance of the second slew rate control circuit and the second output transistor.

3. The circuit of claim 1, wherein a slew rate of an output voltage at the output node does not significantly vary across process, voltage, and temperature variation.

4. The circuit of claim 1, wherein the first output transistor, the first control transistor, and the second control transistor are PMOS transistors, and the second output transistor, the third control transistor, and the fourth control transistor are NMOS transistors.

5. The circuit of claim 1, wherein
the first bias circuit further comprises a first bias variable resistance, a fist bias transistor, and a rising slew rate control resistor and the second bias circuit further comprises a second bias variable resistance, a second bias transistor, and a falling slew rate control resistor.

6. The circuit of claim 1, wherein
the first bias circuit comprises a first bias transistor and a second bias transistor connected in series across the first and the second power supply terminals, the first bias signal node is coupled to gates of the first bias transistor and the second bias transistor and a common node of the first bias transistor and the second bias transistor;
the second bias circuit comprises a third bias transistor and a fourth bias transistor connected in series across the first and the second power supply terminals, the second bias signal node is coupled to gates of the third bias transistor and the fourth bias transistor and a common node of the third bias transistor and the fourth bias transistor; and
the electrical characteristics of the first bias transistor and the third bias transistor are substantially the same as those of the first output transistor and the electrical characteristics of the second bias transistor and the fourth bias transistor are substantially the same as those of the second output transistor.

7. The circuit of claim 6, wherein the first output transistor, the first control transistor, the second control transistor, the first bias transistor, and the third bias transistor are PMOS transistors, and the second output transistor, the third control transistor, the fourth control transistor, the second bias transistor, and the fourth bias transistor are NMOS transistors.

8. The circuit of claim 5, wherein
a first end of the first bias variable resistance is coupled to the first power supply terminal, a second end of the first bias variable resistance is coupled to a first end of the first bias transistor, a second end of the first bias transistor is coupled to a positive input end of the first bias operational amplifier and a first end of the rising slew rate control resistor, a second end of the rising slew rate control resistor is coupled to the second power supply terminal, a gate of the first bias transistor is coupled to the second power supply terminal, a negative input of the first bias operational amplifier is coupled to a power supply terminal whose voltage is an average of the first power supply terminal and the second power supply terminal, an output of the first bias operational amplifier is coupled to an adjusting terminal of the first bias variable resistance and the first bias signal node; and
a first end of the falling slew rate control resistor is coupled to the first power supply, a second end of the falling slew rate control resistor is coupled to a positive input end of the second bias operational amplifier and a first end of the second bias transistor, a negative input end of the second bias operational amplifier is coupled to a power supply terminal whose voltage is an average of the first power supply terminal and the second power supply terminal, a second end of the second bias transistor is coupled to a first end of the second bias variable resistance, a gate of the second bias transistor is coupled to the first power supply terminal, a second end of the second bias variable resistance is coupled to the second power supply terminal, an adjusting terminal of the second bias variable resistance is coupled to an output end of the second bias operational amplifier and the second bias signal node.

9. The circuit of claim 8, wherein the electrical characteristics of the first bias variable resistance and the first bias transistor are respectively substantially the same as those of the first variable resistance of the first slew rate control circuit and the first output transistor, the electrical characteristics of the second bias variable resistance and the second bias transistor are respectively substantially the same as those of the second variable resistance in the second slew rate control circuit and the second output transistor, the rising slew rate control resistor has substantially the same resistance as the falling slew rate control resistor.

10. The circuit of claim 8, wherein the first bias variable resistance comprises a first bias resistor and a first adjustment transistor coupled in parallel, the adjusting terminal of the first variable resistance is a gate of the first adjustment transistor; and the second bias variable resistance comprises a second bias resistor and a second adjustment transistor coupled in parallel, the adjusting terminal of the second of the second variable resistance is a gate of the second adjustment transistor.

11. The circuit of claim 1, further comprising:
an output resistor coupled to the output node and the common node of the first output transistor and the second output transistor.

12. The circuit of claim 1, further comprising:
a first capacitor coupled to the second power supply terminal and a common node of the first output transistor and the first slew rate control circuit; and
a second capacitor coupled to the second power supply terminal and a common node of the second output transistor and the second slew rate control circuit.

13. The circuit of claim 1, further comprising:
a third output transistor and a fourth output transistor coupled in series;
an input complementary node coupled to gates of the third output transistor and the fourth output transistor;
an output complementary node coupled to a common node of the third output transistor and the fourth output transistor;
wherein the first slew rate control circuit is coupled between the first power supply terminal and a common node of the first output transistor and the third output transistor; and the second slew rate control circuit is coupled between the second power supply terminal and a common node of the second output transistor and the fourth output transistor.

14. An output circuit comprising:
a first output transistor and a second output transistor coupled in series;
an input node coupled to gates of the first output transistor and the second output transistor;
an output node coupled to a common node of the first output transistor and the second output transistor;
a first slew rate control circuit coupled between the first output transistor and a first power supply terminal, and configured to provide a first variable resistance in response to a first bias signal from a first bias circuit, the first slew rate control circuit further comprising a first control transistor and a second control transistor coupled in parallel, a gate of the first control transistor coupled to the first output transistor, a gate of the second control transistor coupled to receive the first bias signal; and
a second slew rate control circuit coupled between the second output transistor and a second power supply terminal, and configured to provide a second variable resistance in response to a second bias signal from a second bias circuit, the second slew rate control circuit further comprising a third control transistor and a fourth control transistor coupled in parallel, a gate of the third control transistor coupled to the second output transistor, a gate of the fourth control transistor coupled to receive the second bias signal;
wherein the first bias circuit comprises a first bias transistor and a second bias transistor connected in series across the first and the second power supply terminals, and the second bias circuit comprises a third bias transistor and a fourth bias transistor connected in series across the first and the second power supply terminals.

15. The circuit of claim 14, wherein
the first bias signal node is coupled to gates of the first bias transistor and the second bias transistor and a common node of the first bias transistor and the second bias transistor;
the second bias signal node is coupled to gates of the third bias transistor and the fourth bias transistor and a common node of the third bias transistor and the fourth bias transistor; and
the electrical characteristics of the first bias transistor and the third bias transistor are substantially the same as those of the first output transistor and the electrical characteristics of the second bias transistor and the fourth bias transistor are substantially the same as those of the second output transistor.

16. The circuit of claim 14, wherein the first output transistor, the first control transistor, the second control transistor, the first bias transistor, and the third bias transistor are PMOS transistors, and the second output transistor, the third control transistor, the fourth control transistor, the second bias transistor, and the fourth bias transistor are NMOS transistors.

17. The circuit of claim 14, wherein a first resistance of the first slew rate control circuit and the first output transistor is substantially the same as a second resistance of the second slew rate control circuit and the second output transistor.

18. The circuit of claim 14, wherein a slew rate of an output voltage at the output node does not significantly vary across process, voltage, and temperature variation.

19. An output circuit comprising:
a first output transistor and a second output transistor coupled in series;
an input node coupled to gates of the first output transistor and the second output transistor;
an output node coupled to a common node of the first output transistor and the second output transistor;
a first slew rate control circuit coupled between the first output transistor and a first power supply terminal, and configured to provide a first variable resistance in response to a first bias signal from a first bias circuit, the first slew rate control circuit further comprising a first control transistor and a second control transistor coupled in parallel, a gate of the first control transistor coupled to the first output transistor, a gate of the second control transistor coupled to receive the first bias signal; and
a second slew rate control circuit coupled between the second output transistor and a second power supply terminal, and configured to provide a second variable resistance in response to the first bias signal from the first bias circuit, the second slew rate control circuit further comprising a third control transistor and a fourth control transistor coupled in parallel, a gate of the third control transistor coupled to the second output transistor, a gate of the fourth control transistor coupled to receive the second bias signal;
wherein the first bias circuit comprises a first bias transistor and a second bias transistor connected in series across the first and the second power supply terminals.

20. The circuit of claim 19, wherein
the first bias signal node is coupled to gates of the first bias transistor and the second bias transistor and a common node of the first bias transistor and the second bias transistor; and
the electrical characteristics of the first bias transistor is substantially the same as those of the first output transistor and the electrical characteristics of the second bias transistor is substantially the same as those of the second output transistor.

21. The circuit of claim 19, wherein the first output transistor, the first control transistor, the second control transistor, and the first bias transistor are PMOS transistors, and the second output transistor, the third control transistor, the fourth control transistor, and the second bias transistor are NMOS transistors.

22. The circuit of claim 19, wherein a first resistance of the first slew rate control circuit and the first output transistor is substantially the same as a second resistance of the second slew rate control circuit and the second output transistor.

23. The circuit of claim 19, wherein a slew rate of an output voltage at the output node does not significantly vary across process, voltage, and temperature variation.

* * * * *